United States Patent [19]

Fujishima

[11] Patent Number: 4,839,864
[45] Date of Patent: Jun. 13, 1989

[54] SEMICONDUCTOR MEMORY DEVICE COMPRISING PROGRAMMABLE REDUNDANCY CIRCUIT

[75] Inventor: Kazuyasu Fujishima, Hyogo, Japan

[73] Assignee: Mitsubishi Denki Kabushiki Kaisha, Tokyo, Japan

[21] Appl. No.: 163,015

[22] Filed: Mar. 2, 1988

[30] Foreign Application Priority Data

Mar. 9, 1987 [JP] Japan ................................ 62-53613

[51] Int. Cl.$^4$ ........................................... G11C 7/00
[52] U.S. Cl. ................................................... 365/200
[58] Field of Search ........................... 365/200; 371/10

[56] References Cited

U.S. PATENT DOCUMENTS

| | | | |
|---|---|---|---|
| 4,494,220 | 1/1985 | Dumbri et al. | 365/200 |
| 4,556,975 | 12/1985 | Smith et al. | 365/200 |
| 4,635,232 | 1/1987 | Iwahashi et al. | 365/200 |
| 4,641,285 | 2/1987 | Sasaki et al. | 365/200 |
| 4,648,075 | 3/1987 | Segawa et al. | 365/200 |
| 4,658,379 | 4/1987 | Fujishima et al. | 365/200 |

OTHER PUBLICATIONS

IEEE Journal of Solid-State Circuits: "A Low Power Sub 100ns 256K Bit Dynamic RAM", by S. Fujii et al., vol. SC-18, No. 5, Oct. 1983, pp. 441-446.

Primary Examiner—James W. Moffitt
Attorney, Agent, or Firm—Lowe, Price, LeBlanc, Becker & Shur

[57] ABSTRACT

A semiconductor memory device comprises a plurality of memory cells arranged in a plurality of rows and columns, a plurality of row decoders for selecting one row of the plurality of rows, spare memory cells arranged in one row and a spare decoder for selecting the spare memory cells arranged in the one row. Each of the row decoders comprises a link element which can be melted by a laser beam. A plurality of decoder state determining logical circuits are provided corresponding to the plurality of row decoders. If and when a defective memory cell exists of the memory cells arranged in one row corresponding to each of the row decoders, the link element in the row decoder is melted in advance. When the row decoder having the link element melted in advance is selected by address signals, a corresponding decoder state determining logical circuit generates an SEE signal. The spare decoder is selected in place of the row decoder by the SEE signal.

13 Claims, 10 Drawing Sheets

SEMICONDUCTOR MEMORY DEVICE COMPRISING PROGRAMMABLE REDUNDANCY CIRCUIT

BACKGROUND OF THE INVENTION

1. Field of the Invention

The present invention relates to a semiconductor memory device comprising a programmable redundancy circuit and more particularly, to a structure of a redundancy decoder (spare decoder).

2. Description of the Prior Art

Figure 1:
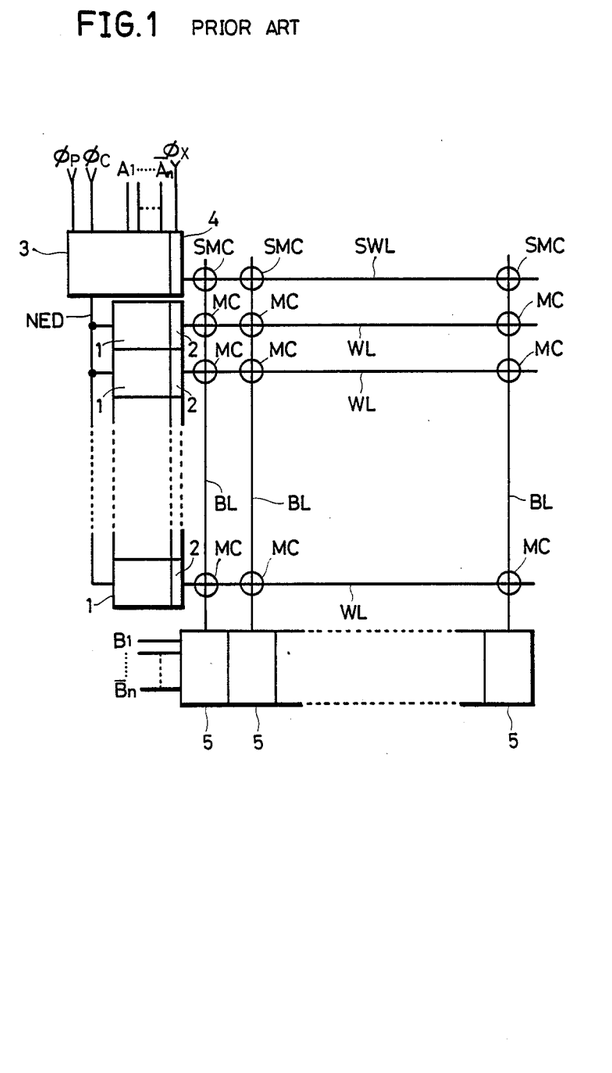
FIG. 1 is a diagram showing a structure of a conventional semiconductor memory device comprising a redundancy circuit.

FIG. 1 is a diagram showing an example of a structure of a conventional semiconductor memory device.

Referring to FIG. 1, a plurality of word lines WL and a plurality of bit lines BL are arranged intersecting with each other. A spare word line SWL is arranged outside the plurality of word lines WL. A memory cell MC is provided at an intersection of each of the word lines WL and each of the bit lines BL. A spare memory cell SMC is provided at an intersection of the spare word line SWL and each of the bit lines BL. A plurality of row decoders 1 are provided corresponding to the plurality of word lines WL. Each of the row decoders 1 is connected to a corresponding word line WL through a word driver 2. In addition, a spare decoder 3 is provided corresponding to the spare word line SWL. The spare decoder 3 is connected to the spare word line SWL through a spare word driver 4. On the other hand, a plurality of column decoders 5 are provided corresponding to the plurality of bit lines BL.

Any of the row decoders 1 is selected in response to address signals $A_1, \overline{A_1}, \ldots, \overline{A_n}$. The selected row decoder 1 applies a predetermined selecting signal to a corresponding word driver 2. The word driver 2 is responsive to a word line driving signal $\Phi_X$ for forcing a corresponding word line WL to be a predetermined potential. Thus, a memory cell MC connected to the word line WL is selected. On the other hand, any of the column decoders 5 is selected in response to address signals $B_1, \overline{B_1}, \ldots, \overline{B_n}$. Thus, the bit line BL corresponding to the selected column decoder 5 is selected. As a result, a single memory cell MC is selected by the row decoder 1 and the column decoder 5. Information stored in the selected memory cell MC is read out or written to the selected memory cell MC.

Meanwhile, a defective memory cell may be produced in a manufacturing step. In this case, the spare word line SWL is selected in place of a word line WL connected to the defective memory cell. More specifically, when an address signal corresponding to the word line WL connected to the defective memory cell is applied, the spare decoder 3 is selected in place of a corresponding row decoder 1. The spare word driver 4 connected to the spare decoder 3 applies a predetermined potential to the spare word line SWL. Thus, if and when the address signal for selecting the defective memory cell is applied, a spare memory cell SMC is selected in place of the defective memory cell.

Figure 2:
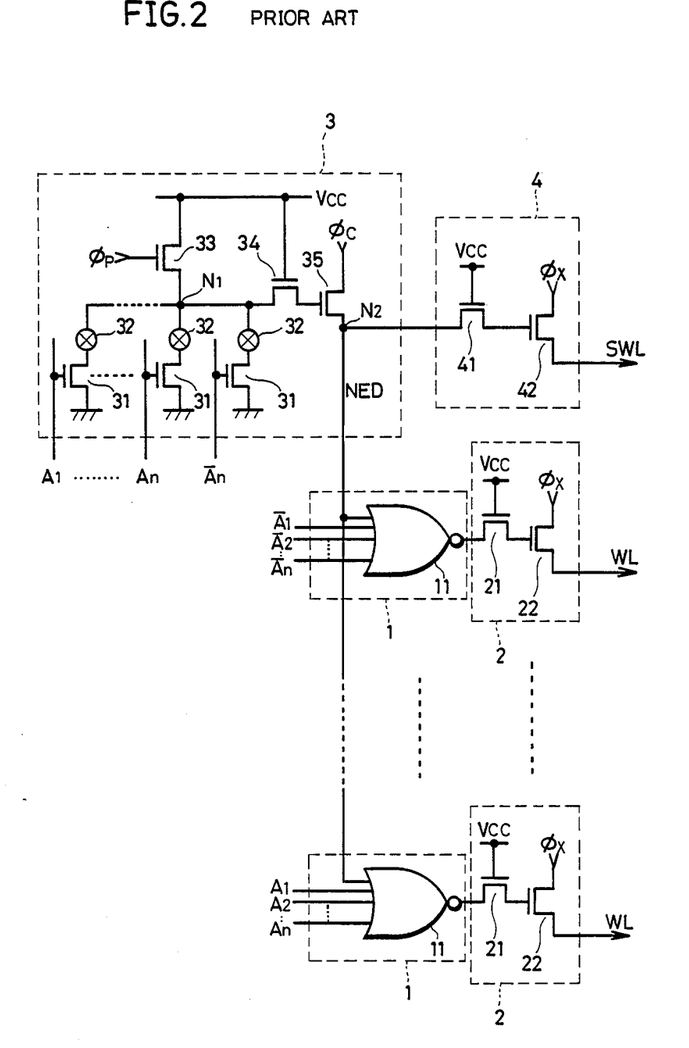
FIG. 2 is a diagram showing a specific circuit structure of a row decoder, a word driver, a spare decoder and a spare word driver included in the semiconductor memory device shown in FIG. 1.

FIG. 2 is a diagram showing a specific circuit structure of main portions shown in FIG. 1. The circuit is described in, for example, an article entitled "A Low Power Sub 100ns 256K Bit Dynamic RAM", IEEE Journal of Solid-State Circuits, Vol. SC-18, No. 5, October 1983, pp. 441–446.

Referring to FIG. 2, each of the row decoders 1 comprises an NOR circuit 11 having a plurality of input terminals. The NOR circuit 11 has one input terminal receiving a Normal Element Disable signal (NED signal) and other plurality of input terminals receiving address signals $A_1$ or $\overline{A_1}$, $A_2$ or $\overline{A_2}$, ..., $A_n$ or $\overline{A_n}$, respectively. Each of the word drivers 2 comprises N channel MOSFETs 21 and 22. The MOSFET 21 is connected between an output terminal of the row decoder 1 and a gate of the MOSFET 22 and has its gate receiving a power-supply potential $V_{CC}$. The MOSFET 22 has one conduction terminal receiving a word line driving signal $\Phi_X$ and other conduction terminal connected to a word line WL.

On the other hand, the spare decoder 3 comprises a plurality of N channel MOSFETs 31, a plurality of link elements 32 and N channel MOSFETs 33, 34 and 35. A plurality of serial circuits each comprising a link element 32 and an MOSFET 31 are connected between a node N1 and a ground terminal. Address signals $A_1, \overline{A_1}, \ldots, A_n$ and $\overline{A_n}$ are applied to gates of the plurality of MOSFETs 31, respectively. In addition, the MOSFET 33 is coupled between the node N1 and the power-supply potential $V_{CC}$ and has its gate receiving a control signal $\Phi_p$. The MOSFET 34 is connected between the node N1 and a gate of the MOSFET 35 and has its gate coupled to the power-supply potential $V_{CC}$. The MOSFET 35 has one conduction terminal receiving a control signal $\Phi_C$ and other conduction terminal connected to a node N2. The above described NED signal is derived from the node N2. The spare word driver 4 comprises N channel MOSFETs 41 and 42. The MOSFET 41 is connected between the node N2 and a gate of the MOSFET 42 and has its gate coupled to the power-supply potential $V_{CC}$. The MOSFET 42 has one conduction terminal receiving the word line driving signal $\Phi_X$ and other conduction terminal connected to a spare word line SWL.

If and when a defective memory cell exists of a plurality of memory cells MC, the link elements 32 in the spare decoder 3 are melted in advance by a laser beam or the like so that an address signal corresponding to a word line WL connected to the defective memory cell is applied.

Figure 3:
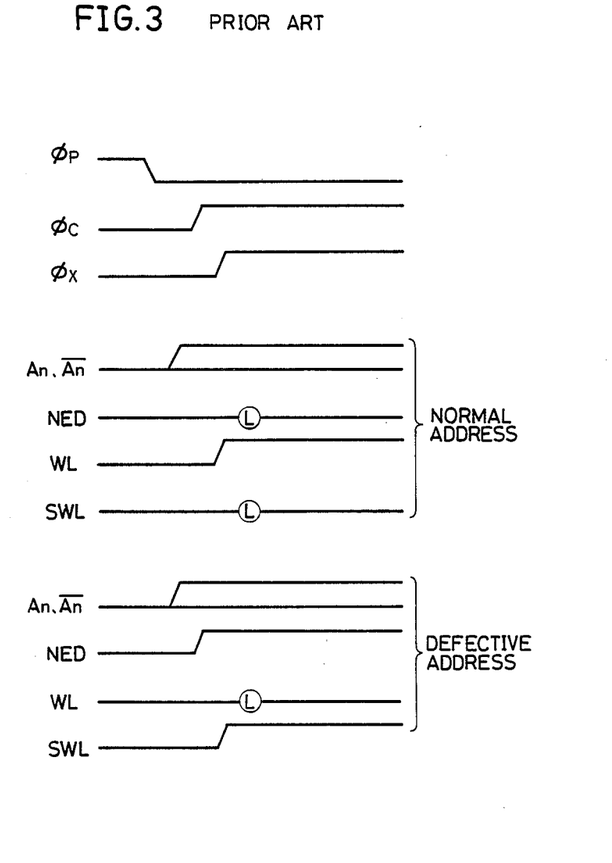
FIG. 3 is a waveform diagram for explaining operation of the semiconductor memory device shown in FIGS. 1 and 2.

Referring now to FIG. 3 of a waveform diagram, operation of the semiconductor memory device shown in FIGS. 1 and 2 is described.

Description is now made on a case in which an address signal corresponding to a word line WL connected to only a normal memory cell MC is applied.

The control signal $\Phi_p$ is at an "H" level, the control signal $\Phi_C$ is at an "L" level and the word line driving signal $\Phi_X$ is at the "L" level in a precharge (standby) period. At that time, since the MOSFETs 33, 34 and 35 are turned on, a potential of the node N2 is at the "L" level. Thus, the NED signal is at the "L" level. The control signal $\Phi_p$ falls to the "L" level, so that the MOSFET 33 is turned off. Then, address signals are applied to the input terminals of each of the row decoders 1. Only one of the row decoders 1 outputs a signal at the "H" level and the other row decoders 1 output a signal at the "L" level in response to the address signals. When all link elements 32 are not disconnected, a potential of the node N1 in the spare row decoder is at the "L" level. Then, the control signal $\Phi_C$ rises to the "H" level. However, since the MOSFET 35 is turned off, the potential of the node N2 does not change. Then, when the word line driving signal $\Phi_X$ rises to the "H" level, a potential on the word line WL corresponding to the row decoder 1 which outputs the signal at the "H" level rises to the "H" level.

Description is now made on a case in which the address signal corresponding to the word line WL connected to the defective memory cell is applied.

The control signal $\Phi_P$ is at the "H" level, the control signal $\Phi_C$ is at the "L" level, the word line driving signal $\Phi_X$ is at the "L" level and the NED signal is at the "L" level in a precharge period. Then, the control signal $\Phi_P$ falls to the "L" level, so that the MOSFET 33 is turned off. The address signals are applied to the row decoder 1 and the spare decoder 3. Consequently, the row decoder 1 corresponding to the word line WL connected to the defective memory cell outputs the signal at the "H" level. At that time, since all of the MOSFETs 31 connected to the link elements 32 which are not melted in the spare decoder 3 are turned off, the potential of the node N1 remains at the "H" level. Thus, the MOSFET 35 remains in the on-state. Then, when the control signal $\Phi_C$ rises to the "H" level, the potential of the node N2 attains the "H" level and the NED signal attains the "H" level. Consequently, the MOSFET 42 in the spare word driver 4 is turned on and outputs of all of the row decoders 1 attain the "L" level. Thus, when the word line driving signal $\Phi_X$ rises to the "H" level, a potential of only the spare word line SWL rises to the "H" level. In the above described manner, the spare word line SWL is selected in place of the word line WL connected to the defective memory cell.

In the conventional semiconductor memory device, since the area occupied by a spare decoder is increased, as compared with the normal decoder, the size of the entire semiconductor memory device is increased and the layout becomes difficult if a number of spare decoders are arranged.

The structure of a redundancy circuit provided in a charging path of a decoder comprising a link which can be melted by a laser is disclosed in U.S. Pat. No. 4,635,232 entitled "Semiconductor Memory Device". In addition, it is disclosed in U.S. Pat. No. 4,494,220 entitled "Folded Bit Line Memory with One Decoder per Pair of Spare Rows" that a link for disconnecting a defective word line is provided for each word line. Furthermore, it is disclosed in U.S. Pat. No. 4,658,379 entitled "Semiconductor Memory Device with a Laser Programmable Redundancy Circuit" that a link for Inactivating a decoder corresponding to a defective memory cell is provided in a charging path in each decoder when the defective memory cell exists.

SUMMARY OF THE INVENTION

An object of the present invention is to provide a semiconductor memory device with a reduced area occupied by a spare decoder.

Another object of the present invention is to provide a semiconductor memory device the size of which is not so increased even if a number of spare decoders are provided with respect to an ordinary decoder.

In order to attain the above described object, a semiconductor memory device comprising a programmable redundancy circuit according to the present invention comprises a plurality of memory cells, at least one spare memory cell, a plurality of decoder means each responsive to a plurality of address signals for selecting any of the plurality of memory cells, each of the decoder means comprising first logical circuit means responsive to a predetermined combination of the plurality of address signals for generating a decoder activating signal, a link element which can be disconnected, and state determining means responsive to the decoder activating signal for generating a spare decoder activating signal when the link element is disconnected, and being responsive to the decoder activating signal from the first logical circuit means for outputting a memory cell selecting signal for selecting the memory cells when the link element is not disconnected, and spare decoder means responsive to the spare decoder activating signal for generating a spare memory cell selecting signal for selecting the spare memory cells.

In the semiconductor memory device according to the present invention, the decoder activating signal is generated from the first logical circuit means included in one of the plurality of decoder means in response to the address signals. When the link element included in the decoder means is disconnected, the state determining means generates the spare decoder activating signal. The spare decoder means is responsive to the spare decoder activating signal for generating the spare memory cell selecting signal. When the link element included in the decoder means for selecting a defective memory cell is disconnected in advance if the defective memory cell exists, a spare memory cell is selected instead of the defective memory cell in response to address signals corresponding to the defective memory cell. In the semiconductor memory device according to the present invention, the state determining means is provided for each of the decoder means, so that the size of the spare decoder means is decreased.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 4:
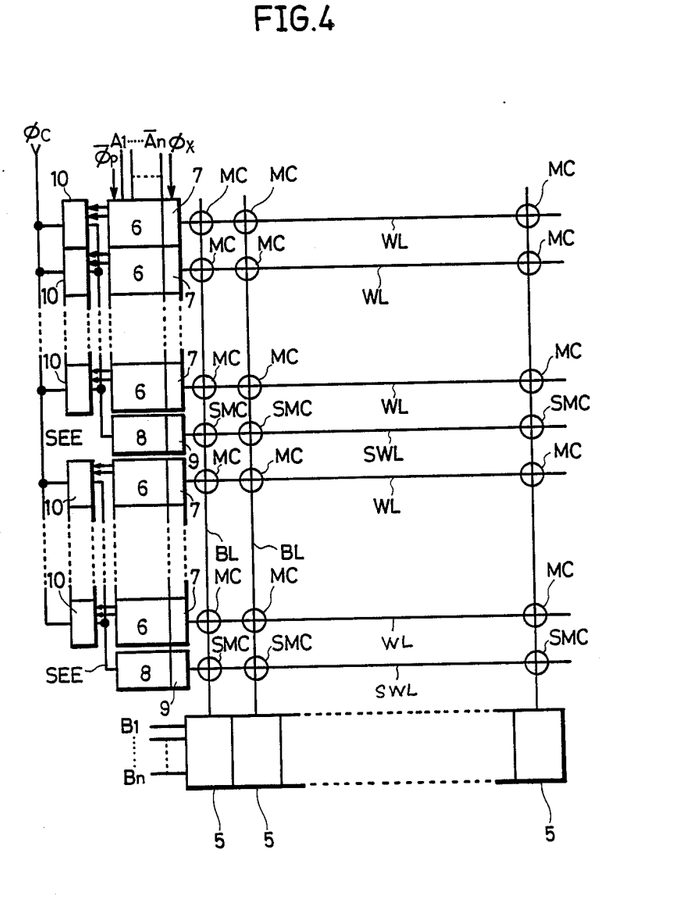
FIG. 4 is a diagram showing a structure of a semiconductor memory device comprising a redundancy circuit according to an embodiment of the present invention.

FIG. 4 is a diagram showing a structure of a semiconductor memory device according to an embodiment of the present invention.

The semiconductor memory device shown in FIG. 4 is the same as the conventional semiconductor memory device shown in FIG. 1 except that row decoders 6, word drivers 7, spare decoders 8 and spare word drivers 9 are provided in place of the row decoders 1, the word drivers 2, the spare decoder 3 and the spare word driver 4 and decoder state determining logical circuits 10 are provided.

Figure 5:
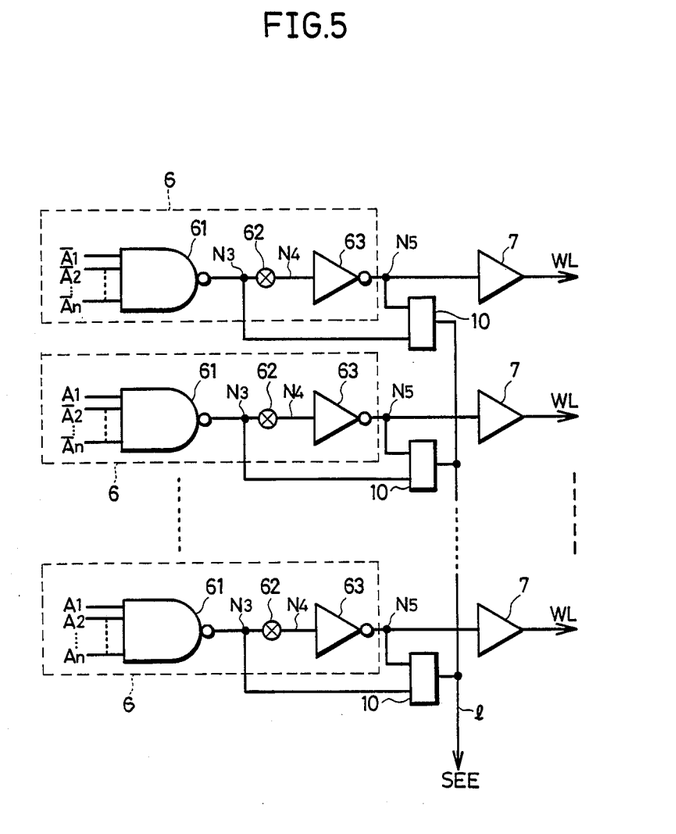
FIG. 5 is a diagram showing row decoders, decoder state determining logical circuits and word drivers included in the semiconductor memory device shown in FIG. 4.

FIG. 5 is a diagram showing structures of the row decoders 6, the word drivers 7 and the decoder state determining logical circuits 10 included in the semiconductor memory device shown in FIG. 4.

Each of the row decoders 6 comprises an NAND circuit 61 having a plurality of input terminals, a link element 62 which can be melted by a laser beam or the like and an inverter 63. The link element 62 is formed of polysilicon (polycrystalline silicon) and the like. Address signals $A_1$ or $\overline{A_1}$, $A_2$ or $\overline{A_2}$, ..., $A_n$ or $\overline{A_n}$ are applied to input terminals of the NAND circuit 61, respectively. The NAND circuit 61 has its output terminal connected to an input terminal of the inverter 63 through the link element 62. The inverter 63 has its output terminal connected to a word line WL through each of the word drivers 7. An output signal from the NAND circuit 61 and an output signal from the inverter 63 are applied to each of the decoder stat determining logical circuits 10. Output signals from the decoder state determining logical circuits 10 are a Spare Element Enable signal (SEE signal).

Figure 6:
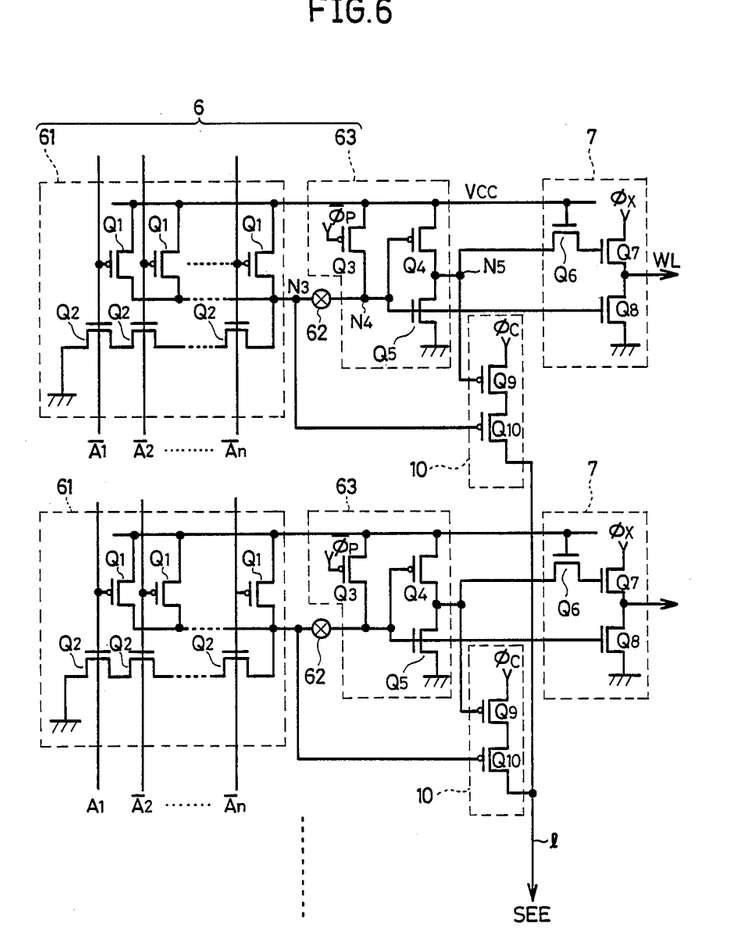
FIG. 6 is a diagram showing a specific circuit structure of the row decoders, the decoder state determining logical circuits and the word drivers shown in FIG. 5.

FIG. 6 is a diagram showing more specific structures of the circuits shown in FIG. 5.

Each of the NAND circuits 61 comprises a plurality of P channel MOSFETs Q1 and a plurality of N channel MOSFETs Q2. The plurality of MOSFETs Q1 are coupled in parallel between a power-supply potential $V_{CC}$ and a node N3. The plurality of MOSFETs Q2 are coupled in series between the node N3 and a ground potential. Each of the MOSFETs Q1 and each of the MOSFETs Q2 have their gates connected to corresponding input terminals. Address signals $A_1$ or $\overline{A_1}$, $A_2$ or $\overline{A_2}$, ..., $A_n$ or $\overline{A_n}$ are applied to the input terminals, respectively. Only when all of the address signals applied to the plurality of input terminals are at an "H" level, the NAND circuit 61 outputs a signal at an "L" level.

Each of the inverters 63 comprises P channel MOSFETs Q3 and Q4 and an N channel MOSFET Q5. The MOSFET Q3 is coupled between the power-supply potential $V_{CC}$ and a node N4 and has its gate receiving a control signal $\overline{\Phi_P}$. The MOSFET Q4 is coupled between the power-supply potential $V_{CC}$ and a node N5 and has its gate connected to the node N4. The MOSFET Q5 is coupled between the node N5 and the ground potential and has its gate connected to the node N4. MOSFETs Q4 and Q5 constitute an inverter. A link element 62 is connected between the nodes N3 and N4. In the inverter 63, when the control signal $\overline{\Phi_P}$ is at the "L" level, the MOSFET Q3 is turned on, so that a potential of the node N4 attains the power-supply potential $V_{CC}$, i.e., the "H" level. At that time, a potential of the node N5 attains the ground potential, i.e., the "L" level. When the control signal $\overline{\Phi_P}$ is at the "H" level, a potential of the node N3 of the NAND circuit 61 is transmitted to the node N4 through the link element 62.

Each of the decoder state determining logical circuits 10 comprises P channel MOSFETs Q9 and Q10. The MOSFET Q9 has one conduction terminal receiving a control signal $\Phi_C$ and other conduction terminal connected to one conduction terminal of the MOSFET Q10. The MOSFET Q9 has its gate connected to the node N5. The MOSFET Q10 has its gate connected to the node N3. The MOSFETs Q10 in all of the decoder state determining logical circuits 10 have other conduction terminals connected together to an SEE signal line l. Only when both the potentials of the nodes N3 and N5 are at the "L" level, the decoder state determining logical circuits 10 output the control signal $\Phi_C$ to the SEE signal line l as an SEE signal. More specifically, only when a signal at the "L" level is outputted from the NAND circuit 61 with the link element 62 disconnected, the control signal $\Phi_C$ is transmitted to the SEE signal line l.

Each of the word drivers 7 comprises N channel MOSFETs Q6, Q7 and Q8. The MOSFET Q6 is connected between the node N5 and a gate of the MOSFET Q7 and has its gate coupled to the power-supply potential. The MOSFET Q7 has one conduction terminal receiving a word line driving signal $\Phi_X$ and other conduction terminal connected to the word line WL. The MOSFET Q8 is coupled between the word line WL and the ground potential and has its gate connected to the node N4. When the word line driving signal $\Phi_X$ attains the "H" level with the potential of the node N4 being at the "L" level, the word driver 7 raises a potential on the word line WL to the "H" level.

Figure 7:
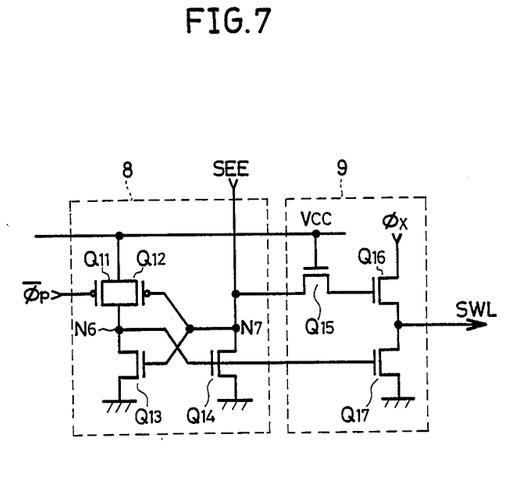
FIG. 7 is a diagram showing a specific circuit structure of a spare decoder and a spare word driver included in the semiconductor memory device shown in FIG. 5.

FIG. 7 is a diagram showing specific circuit structures of each of the spare decoders 8 and each of the spare word drivers 9 included in the semiconductor memory device shown in FIG. 4.

The spare decoder 8 comprises P channel MOSFETs Q11 and Q12 and N channel MOSFETs Q13 and Q14. The MOSFETs Q11 and Q12 are coupled between the power-supply potential $V_{CC}$ and a node N6. The MOSFET Q11 has its gate receiving a control signal $\overline{\Phi_P}$. The MOSFET Q12 has its gate connected to a node N7. The MOSFET Q13 is coupled between the node N6 and the ground potential and has its gate connected to the node N7. The MOSFET Q14 is coupled between the node N7 and the ground potential and has its gate connected to the node N6. An SEE signal is applied to the node N7 from the decoder state determining logical circuits 10.

The spare word driver 9 comprises N channel MOSFETs Q15, Q16 and Q17. The MOSFET Q15 is connected between the node N7 and a gate of the MOSFET Q16 and has its gate coupled to the power-supply potential $V_{CC}$. The MOSFET Q16 has one conduction terminal receiving the word line driving signal $\Phi_X$ and other conduction terminal connected to a spare word line SWL. The MOSFET Q17 is coupled between the spare word line SWL and the ground potential and has its gate connected to the node N6.

When the SEE signal is at the "L" level, the MOSFET Q12 is turned on, so that a potential of the node N6 attains the "H" level. Consequently, the MOSFET Q17 is turned on, so that a potential on the spare word line SWL attains the "L" level. In addition, when the control signal $\overline{\Phi_P}$ is at the "L" level, the MOSFET Q11 is turned on, so that the potential of the node N6 attains the "H" level. Consequently, in the same manner, the MOSFET Q17 is turned on, so that the potential on the spare word line SWL attains the "L" level. When the SEE signal is at the "H" level, the MOSFETs Q13 and Q16 are turned on, so that the potential of the node N6 attains the "L" level. Consequently, the MOSFET Q17 is turned off. Thus, when the word line driving signal $\Phi_X$ rises to the "H" level, the potential on the spare word line SWL rises to the "H" level.

Figure 8:
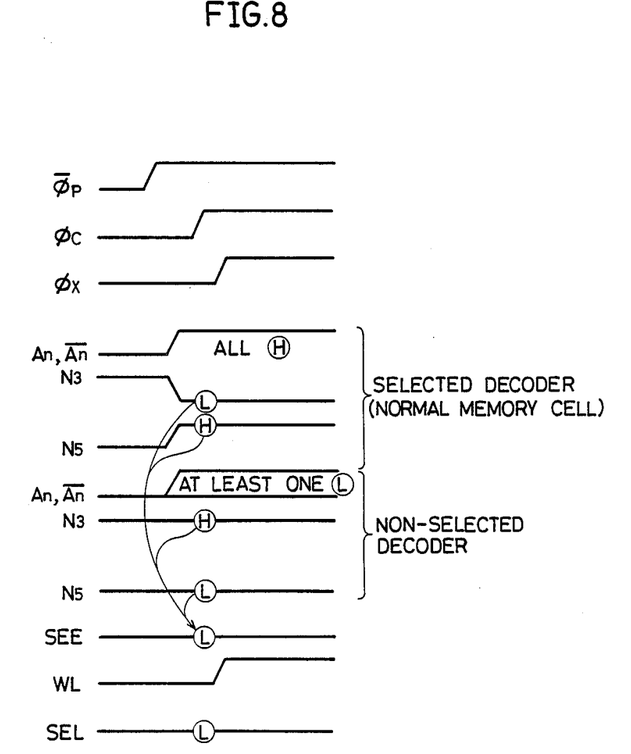
FIG. 8 is a waveform diagram for explaining operation of the semiconductor memory device shown in FIGS. 4 to 7.
Figure 9:
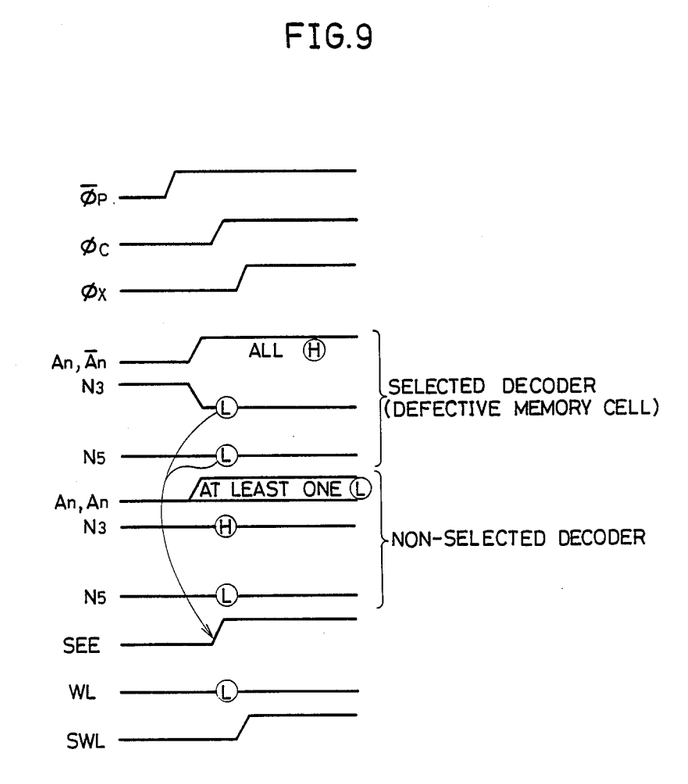
FIG. 9 is a waveform diagram for explaining operation of the semiconductor memory device shown in FIGS. 4 to 7.

Referring now to FIGS. 8 and 9 of waveform diagrams, operation of the semiconductor memory device shown in FIGS. 4 to 7 is described.

If and when a defective memory cell exists of a plurality of memory cells MC, a link element 62 corresponding to a word line WL connected to the defective memory cell is melted in advance by a laser beam or the like.

Description is now made on a case in which address signals corresponding to word lines WL connected to only normal memory cells MC are applied.

The control signals $\overline{\Phi_P}$ and $\Phi_C$ and the word line driving signal $\Phi_X$ attain the "L" level in a precharge (standby) period. Consequently, the potential of the node N4 attains the "H" level and the potential of the node N5 attains the "L" level. Thus, the potentials on all of the word lines WL are at the "L" level (in FIG. 6). At that time, the potential of the node N6 attains the "H" level and the potential of the node N7 attains the "L" level. Thus, the potential on the spare word line SWL is also at the "L" level (in FIG. 7).

In FIG. 6, the control signal $\overline{\Phi_P}$ rises to the "H" level and then, address signals are applied to the input terminals of each of the NAND circuits 61. Only one of the NAND circuits 61 outputs a signal at the "L" level and the other NAND circuits 61 output a signal at the "H" level in response to the address signals. A single row decoder 6 is thus selected. Consequently, in the selected row decoder 6, the potential of the node N3 attains the "L" level and the potential of the node N5 attains the "H" level. At that time, in each of row decoders 6 which are not selected, the potential of the node N3 remains at the "H" level and the potential of the node N5 remains at the "L" level. Thus, any of the decoder state determining logical circuits 10 is not ready to transmit the control signal $\Phi_C$ to the SEE signal line 1. As a result, even if the control signal $\Phi_C$ rises to the "H" level, the SEE signal remains at the "L" level. When the word line driving signal $\Phi_X$ rises to the "H" level, the potential on the word line WL rises to the "H" level because the MOSFET Q7 is turned on in the word driver 7 corresponding to the selected row decoder 6. At that time, since the MOSFET Q7 is turned off in each of the word drivers 7 corresponding to the non-selected row decoders 6, the potential on the word line WL remains at the "L" level. On the other hand, in FIG. 7, since the SEE signal is at the "L" level, the potential on the spare word line SWL remains at the "L" level.

Referring now to FIG. 9, description is made on a case in which address signals corresponding to a word line WL connected to a defective memory cell MC12 are applied.

The standby period is the same as that shown in FIG. 8. The control signal $\overline{\Phi_P}$ rises to the "H" level and then, the address signals are applied to the input terminals of each of the NAND circuits 61. Consequently, a row decoder 6 including a link element 62 which has been melted in advance is selected. In the selected row decoder 6, the potential of the node N3 attains the "L" level. However, since the link element 62 is disconnected, the potential of the node N5 remains at the "L" level. Thus, the potential on the word line WL remains at the "L" level. On the other hand, the decoder state determining logical circuit 10 is ready to transmit the control signal $\Phi_C$ to the SEE signal line 1 as the SEE signal. Thus, when the control signal $\Phi_C$ rises to the "H" level, the SEE signal rises to the "H" level in response to the rise. As a result, since the potential of the node N7 rises to the "H" level in the spare decoder 8, the MOSFET Q17 is turned off and the MOSFET Q16 is turned on. Thus, when the word line driving signal $\Phi_X$ rises to the "H" level, the potential on the spare word line SWL rises to the "H" level in response to the rise. The operation of each of the non-selected row decoders 6 is the same as that described in FIG. 8. In the above described manner, when the address signals corresponding to the word line WL connected to the defective memory cell are applied, the spare word line SWL is selected in place of the word line WL.

Figure 10:
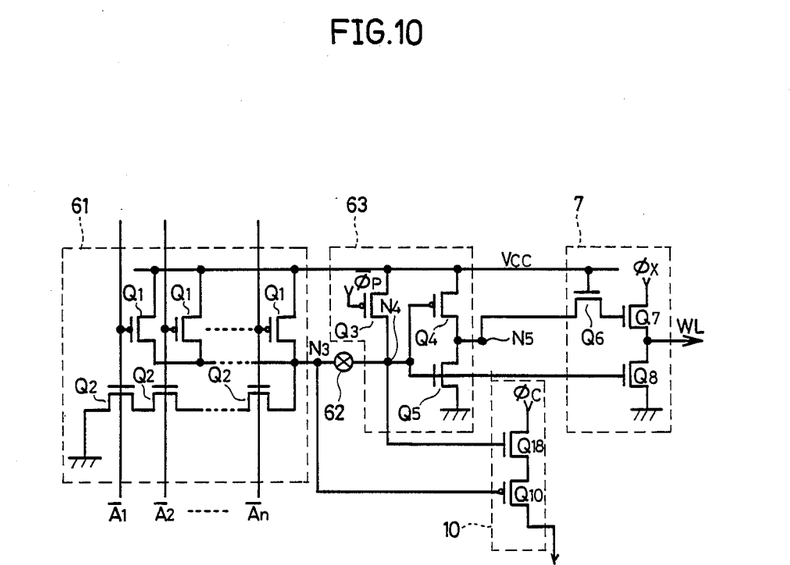
FIG. 10. is a diagram showing an example of another structure of the decoder state determining logical circuit included in the semiconductor memory device shown in FIG. 4.

FIG. 10 is a diagram showing an example of another structure of each of the decoder state determining logical circuits 10.

The decoder state determining logical circuit 10 is the same as the decoder state determining logical circuit 10 shown in FIG. 6 except that the P channel MSFET Q9 is replaced with an N channel MOSFET Q18. The MOSFET Q18 has its gate connected to the node N4.

As described in the foregoing, according to the above described embodiment, since the SEE signal is generated from the decoder state determining logical circuits 10 provided for each of the row decoders 6 and the spare decoders 8 are activated by the SEE signal, the structure of each of the spare decoders 8 is simplified and the area occupied by the spare decoder 8 is decreased. Thus, the size of the semiconductor memory device is not so increased even if the number of the spare decoders 8 is increased, as compared with the number of the ordinary decoders 6.

Although the present invention has been described and illustrate in detail, it is clearly understood that the same is by way of illustration and example only and is not to be taken by way of limitation, the spirit and scope of the present invention being limited only by the terms of the appended claims.

What is claimed is:

1. A semiconductor memory device having a programmable redundancy circuit, comprising:
   a plurality of memory cells,
   at least one spare memory cell,
   a plurality of decoder means each responsive to a plurality of address signals for selecting any of said plurality of memory cells,
   each one of said decoder means comprising (a) first logical circuit means responsive to a predetermined combination of said plurality of address signals for generating a decoder activating signal, (b) a link element which can be disconnected and (c) state determining means independent of the other ones of said decoder means and being responsive to said decoder activating signal when said link element is disconnected, and being responsive to said decoder activating signal from said first logical circuit means for outputting a memory cell selecting signal for selecting said memory cells when said link element is not disconnected, and spare decoder means responsive to said spare decoder activating signal for generating a spare memory cell selecting signal for selecting said spare memory cells.

2. A semiconductor memory device according to claim 1, wherein said state determining means comprises an input terminal receiving a predetermined potential, an output terminal from which the spare decoder activating signal is outputted, and first and second switching means connected in series between said input terminal and said output terminal, said first switching means being rendered conductive when said link element is disconnected and said second switching means being rendered conductive in response to said decoder activating signal.

3. A semiconductor memory device according to claim 2, which further comprises second logical circuit means comprising an input terminal, an output terminal and third switching means responsive to a predetermined setting signal for initializing said input terminal to a predetermined potential and responsive to a signal applied to said input terminal for deriving a signal at a predetermined level from said output terminal, said link element having one terminal coupled to said decoder activating signal from said first logical circuit means and other terminal coupled to said input terminal of said second logical circuit means, said first switching means in said sate determining means having a control terminal coupled to said output terminal of said second logical circuit means, and said second switching means in said state determining means having a control terminal coupled to said one terminal of said link element.

4. A semiconductor memory device according to claim 3, which further comprises inverting means connected between said input terminal and said output terminal of said second logical circuit means.

5. A semiconductor memory device according to claim 4, wherein said first logical circuit means has a plurality of input terminals receiving said plurality of address signals and one output terminal, and derives said decoder activating signal at a second logical level from said output terminal when all of said plurality of address signals are at a first logical level.

6. A semiconductor memory device according to claim 5, wherein said first switching means, said second switching means and said third switching means comprise a transistors, respectively.

7. A semiconductor memory device according to claim 1, wherein said link element can be disconnected by a laser beam or the like.

8. A semiconductor memory device comprising a programmable redundancy circuit, comprising:

a plurality of memory cells arranged in a plurality of rows and columns, a plurality of spare memory cells arranged in at least one row, a plurality of decoder means each responsive to a plurality of address signals for selecting one row of said plurality of rows, each one of said decoder means comprising (a) first logical circuit means responsive to a predetermined combination of said plurality of address signals for generating a decoder activating signal, (b) a link element which can be disconnected and (c) state determining means independent of the other ones of said decoder means and being responsive to said decoder activating signal when said link element is disconnected, and being responsive to said decoder activating signal from said first logical circuit means for outputting a memory cell selecting signal for selecting said memory cells when said link element is not disconnected, and spare decoder means responsive to said spare decoder activating signal for generating a spare memory cell selecting signal for selecting said spare memory cells.

9. A semiconductor memory device according to claim 8, wherein said state determining means comprises an input terminal receiving a predetermined potential, an output terminal from which the spare decoder activating signal is outputted, and first and second switching means connected in series between said input terminal and said output terminal, said first switching means being rendered conductive when said link element is disconnected and said second switching means being rendered conductive in response to said decoder activating signal.

10. A semiconductor memory device according to claim 9, which further comprises second logical circuit means comprising an input terminal, an output terminal and third switching means responsive to a predetermined setting signal for initializing said input terminal to a predetermined potential and responsive to a signal applied to said input terminal for deriving a signal at a predetermined level from said output terminal, said link element having one terminal coupled to said decoder activating signal from said first logical circuit means and other terminal coupled to said input terminal of said second logical circuit means, said first switching means in said sate determining means having a control terminal coupled to said output terminal of said second logical circuit means, and said second switching means in said state determining means having a control terminal coupled to said one terminal of said link element.

11. A semiconductor memory device comprising a programmable redundancy circuit, comprising:

a plurality of memory cells, at least one spare memory cell, a plurality of decoder means each responsive to a plurality of address signals for selecting any of said plurality of memory cells, each of said decoder means comprising first logical circuit means responsive to a predetermined combination of said plurality of address signals for generating a decoder activating signal, a link element which can be disconnected and state determining means responsive to said decoder activating signal for generating a spare decoder activating signal when said link element is disconnected, and being responsive to said decoder activating signal from said first logical circuit means for outputting a memory cell selecting signal for selecting said memory cells when said link element is not disconnected, spare decoder means responsive to said spare decoder activating signal for generating a spare memory cell selecting signal for selecting said spare memory cells, and wherein said state determining means comprises an input terminal receiving a predetermined potential, an output terminal from which the spare decoder activating signal is outputted, and first and second switching means connected in series between said input terminal and said output terminal, said first switching means being rendered conductive when said link element is disconnected and said second switching means being rendered conductive in response to said decoder activating signal.

12. A semiconductor memory device comprising a programmable redundancy circuit, comprising:

a plurality of memory cells, at least one spare memory cell, a plurality of decoder means each responsive to a plurality of address signals for selecting any of said plurality of memory cells, each of said decoder means comprising first logical circuit means responsive to a predetermined combination of said plurality of address signals for generating a decoder activating signal, a link element which can be disconnected and state determining means responsive to said decoder activating signal for generating a spare decoder activating signal when said link element is disconnected, and being responsive to said decoder activating signal from said first logical circuit means for outputting a memory cell selecting signal for selecting said memory cells when said link element is not disconnected, spare decoder means responsive to said spare decoder activating signal for generating a spare memory cell selecting signal for selecting said spare memory cells, and wherein said link element can be disconnected by a laser beam or the like.

13. A semiconductor memory device comprising a programmable redundancy circuit, comprising:

a plurality of memory cells arranged in a plurality of rows and columns, a plurality of spare memory cells arranged in at least one row, a plurality of decoder means each responsive to a plurality of address signals for selecting one row of said plurality of rows, each of said decoder means comprising first logical circuit means responsive to a predetermined combination of said plurality of address signals for generating a decoder activating signal, a link element which can be disconnected and state determining means responsive to said decoder activating signal when said link element is disconnected, and being responsive to said decoder activating signal from said first logical circuit means for outputting a memory cell selecting signal for selecting said memory cells when said link element is not disconnected, and spare decoder means responsive to said spare decoder activating signal for generating a spare memory cell selecting signal for selecting said spare memory cells wherein, said state determining means comprises an input terminal receiving a predetermined potential, an output terminal from which the spare decoder activating signal is outputted, and first and second switching means connected in series between said input terminal and said output terminal, said first switching means being rendered conductive when said link element is disconnected and said second switching means being rendered conductive in response to said decoder activating signal.

* * * * *